United States Patent
Park et al.

(10) Patent No.: US 7,986,560 B2
(45) Date of Patent: Jul. 26, 2011

(54) FLASH MEMORY DEVICES THAT UTILIZE AGE-BASED VERIFY VOLTAGES TO INCREASE DATA RELIABILITY AND METHODS OF OPERATING SAME

(75) Inventors: Ki-Tae Park, Gyeonggi-do (KR); Yong-Seok Kim, Seoul (KR); Ki-Nam Kim, Seoul (KR); Yeong-Taek Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/558,717

(22) Filed: Sep. 14, 2009

(65) Prior Publication Data

US 2010/0002523 A1    Jan. 7, 2010

Related U.S. Application Data

(63) Continuation of application No. 11/943,887, filed on Nov. 21, 2007, now Pat. No. 7,692,970.

(30) Foreign Application Priority Data

Nov. 22, 2006  (KR) ................. 2006-116004

(51) Int. Cl.
   *G11C 11/34*    (2006.01)

(52) U.S. Cl. ................. 365/185.22; 365/185.28

(58) Field of Classification Search ............. 365/185.22, 365/185.29
See application file for complete search history.

(56) References Cited

U.S. PATENT DOCUMENTS

| | | | |
|---|---|---|---|
| 6,108,263 A * | 8/2000 | Bauser et al. | 365/189.15 |
| 6,122,198 A | 9/2000 | Haddad et al. | 365/185.22 |
| 6,522,580 B2 | 2/2003 | Chen et al. | |
| 6,654,287 B2 * | 11/2003 | Visconti | 365/185.22 |
| 6,768,682 B2 | 7/2004 | Yano et al. | |
| 7,038,950 B1 * | 5/2006 | Hamilton et al. | 365/185.28 |
| 2003/0133329 A1 | 7/2003 | Satoh | 365/185.22 |
| 2004/0130943 A1 | 7/2004 | Hirano et al. | |
| 2005/0057997 A1 | 3/2005 | Mitani et al. | |
| 2006/0291290 A1 | 12/2006 | Kim et al. | |

FOREIGN PATENT DOCUMENTS

JP    08-203286    8/1996

(Continued)

OTHER PUBLICATIONS

Yamada et al., "A Novel Analysis Method of Threshold Voltage Shift due to Detrap in a Multi-level Flash Memory," 2001 Symposium on VLSI Technology Digest of Technical Papers, 2001 IEEE, 2 pages.

(Continued)

*Primary Examiner* — Son T Dinh
(74) *Attorney, Agent, or Firm* — Myers Bigel Sibley & Sajovec (57) ABSTRACT

Disclosed is a method of verifying a programmed condition of a flash memory device, being comprised of: determining a level of an additional verifying voltage in response to the number of programming/erasing cycles of memory cells; conducting a verifying operation to programmed memory cells with an initial verifying voltage lower than the additional verifying voltage; and selectively conducting an additional verifying operation with the additional verifying voltage to the program-verified memory cells in response to the number of programming/erasing cycles.

15 Claims, 7 Drawing Sheets

| | FOREIGN PATENT DOCUMENTS | | KR | 1020060030171 A | 4/2006 |
|----|----------------|--------|----|----|----|
| JP | 11-031391      | 2/1999 | | | |
| JP | 11-126493      | 5/1999 | | | |
| JP | 2001-023384    | 1/2001 | | | |
| JP | 2003-173688    | 6/2003 | | | |
| JP | 2005-092948    | 4/2005 | | | |
| KR | 1020040049114 A | 6/2004 | | | |
| KR | 1020050027950 A | 3/2005 | | | |

OTHER PUBLICATIONS

Notice to File a Response/Amendment to the Examination Report, Korean Application No. 10-2005-0055906, Aug. 14, 2006, 4 pages.

* cited by examiner

Fig. 1

(PRIOR ART)

Fig. 2

(PRIOR ART)

FLASH MEMORY DEVICES THAT UTILIZE AGE-BASED VERIFY VOLTAGES TO INCREASE DATA RELIABILITY AND METHODS OF OPERATING SAME

REFERENCE TO PRIORITY APPLICATION

This application is a continuation of U.S. patent application Ser. No. 11/943,887, filed Nov. 21, 2007, now U.S. Pat. No. 7,692,970, the contents of which are hereby incorporated herein by reference.

FIELD

The present invention relates to nonvolatile memory devices and, more particularly, to flash memory devices and methods of operating flash memory devices.

BACKGROUND

Nonvolatile memory devices are capable of retaining data stored in their cells, without loss, even when power is removed. Flash memories are widely used as a type of nonvolatile memory device suitable in portable information apparatuses such as mobile phones, personal digital assistants (PDAs), or digital cameras, for example.

Figure 1:
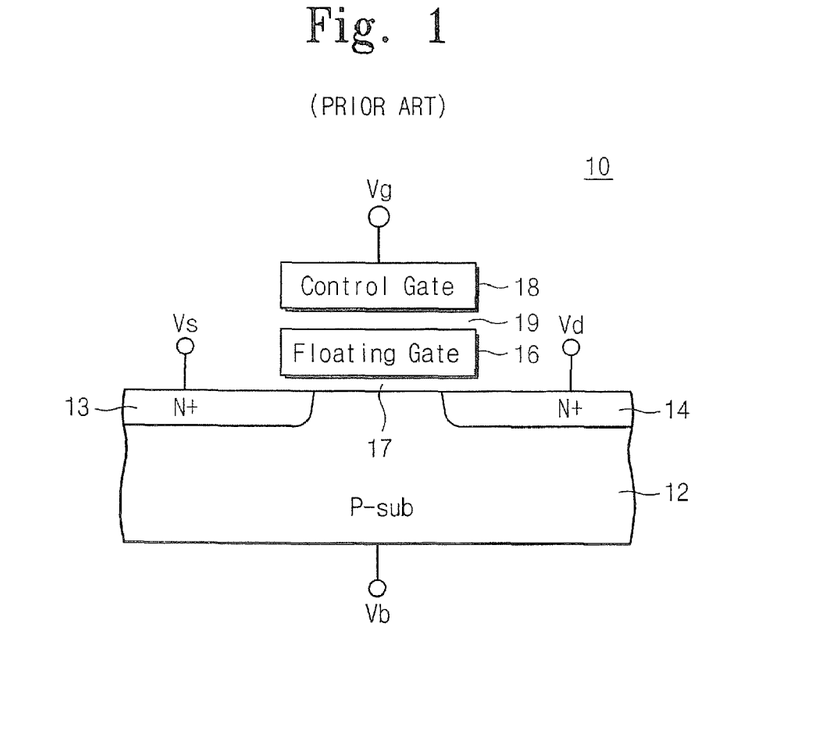
FIG. 1 is a sectional diagram of a conventional flash memory cell.

FIG. 1 is a cross-sectional diagram of a conventional flash memory cell. Referring to FIG. 1, a flash memory cell 10 has a source 13 and a drain 14 formed of $N^+$ impurities, and a channel region therebetween, in a semiconductor substrate 12. On the channel region are sequentially formed an insulation film 17 with a thickness of about 100 Å, and a floating gate 16. On the floating gate 16 are sequentially formed an oxide-nitride-oxide (ONO) insulation film 19 and a control gate 18. The source 13, the drain 14, the floating gate 16, the control gate 16, and the semiconductor substrate 12 are coupled to voltages Vs. Vg, Vd, and Vb, respectively, for programming, erasing, and reading the flash memory cell 10.

Flash memories are generally divided into NOR and NAND types in accordance with interconnection conditions between cells and bit lines. In a NOR flash memory, one bit line is connected to two or more cell transistors in parallel, and data is stored in the hot-electron mode and erased in the Fowler-Nordheim (F-N) tunneling mode. In a NAND flash memory, one bit line is connected to two or more cell transistors in series, and data is stored and erased in the F-N tunneling mode. The cell type (i.e., the NOR or NAND type), and the mechanism of storing and erasing data (i.e., the hot-electron mode or the F-N tunneling mode), determines the voltage levels of Vs, Vg, Vd, and Vb shown in FIG. 1. In general, NOR flash memories may be disadvantageous to high-density integration because of large current consumption, but advantageous to high-frequency operations. Alternatively, NAND flash memories may be advantageous to high-density integration because of smaller cell currents than the NOR flash memories.

Another important factor of the flash memory, along with operational performance, is reliability. Usually, the flash memory operates to repeat program and erase cycles, but the number of the program and erase cycles (i.e., P/E cycles) may be limited to a predetermined number. For example, it is permissible for a memory to carry out the erase operation through about ten thousands cycles before its memory blocks are regarded as being worn out. For another memory, it is possible to conduct the erase operation up to a hundred thousand or million cycles until its blocks are regarded as being worn out (i.e., "aged out").

Once one or more blocks have been worn out, functional degradation occurs. In a flash memory system, the endurance of memory blocks is mostly determined by the number of P/E cycles that the blocks undergo. One of the typical factors to degrade the performance of a flash memory is a detrapping effect of electrons and holes accumulated in the flash memory cells. The detrapping effect of a flash memory cell and the problems thereof are discussed in 2001 IEEE Symposium on VLSI Technology, Digest of Technical Papers, pp. 115-116, entitled "A Novel Analysis Method of Threshold Voltage Shift due to Detrap in a multi-level Flash memory".

Figure 2:
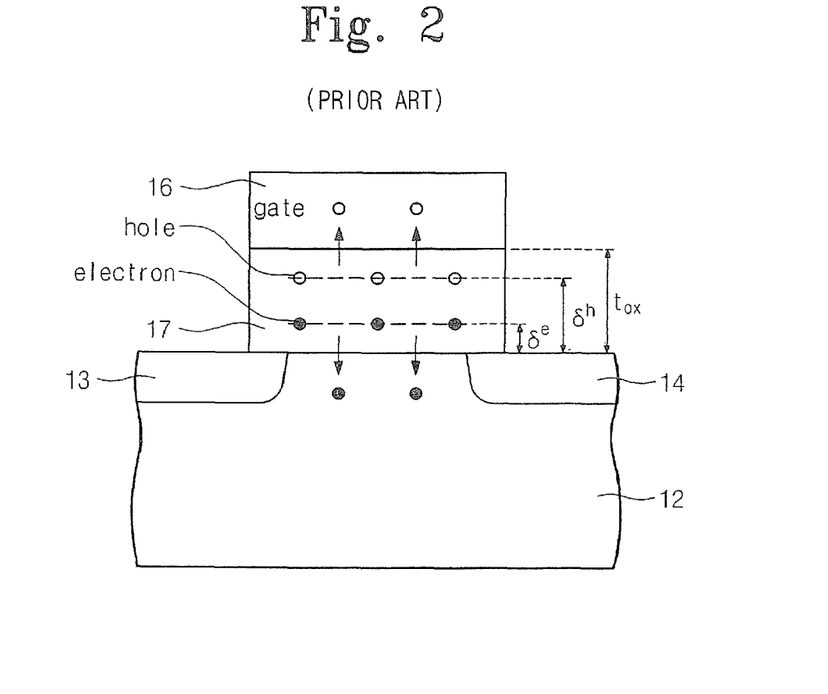
FIG. 2 is a sectional diagram showing a detrapping effect of electrons and holes due to an increase in program/erase cycle times.
Figure 3:
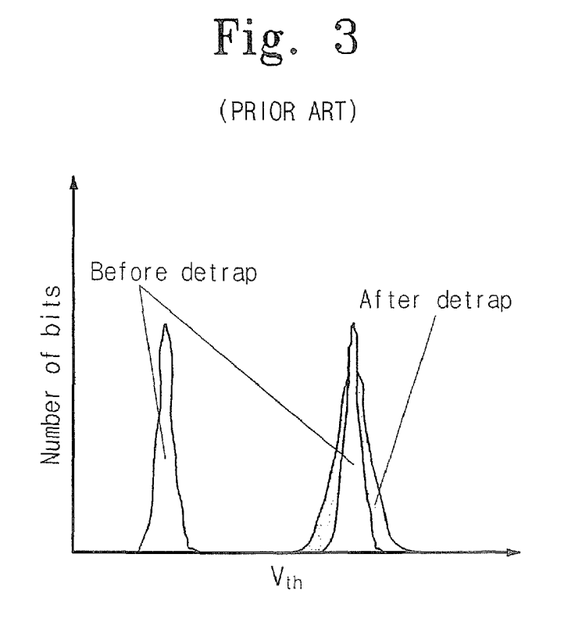
FIGS. 3 and 4 are graphic diagrams showing variations of threshold voltages by the detrapping effect of electrons and holes.
Figure 4:
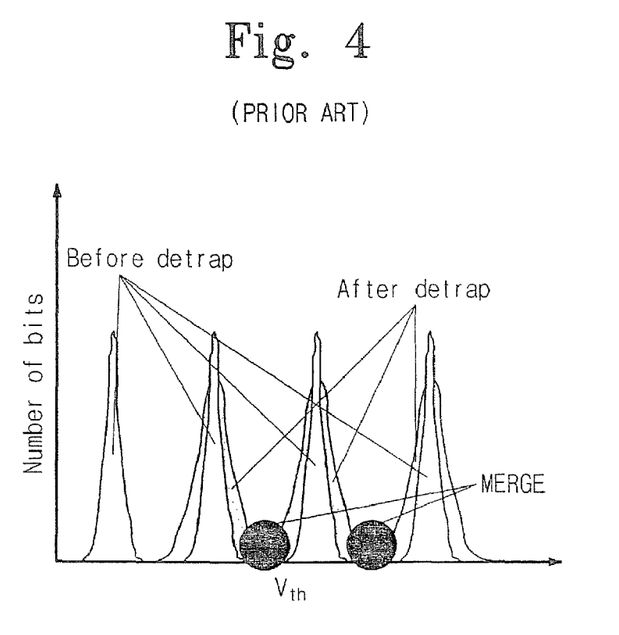

FIG. 2 is a sectional diagram showing the detrapping effect of electrons and holes due to an increase in P/E cycles. FIGS. 3 and 4 are graphic diagrams showing variations of threshold voltages caused by the detrapping effect of electrons and holes. FIG. 3 shows distribution profiles of threshold voltages after programming single-level cells each storing 1-bit data per cell, and FIG. 4 shows distribution profiles of threshold voltages after programming multi-level cells each storing n-bit data (n is 2 or an integer larger than 2) per cell. Here, the floating gates accompanied with the detrapping effect are not restrictive to those of a general flash memory device, which are made of a conductive material. For example, the detrapping effect may occur in a charge-trap flash memory using an insulation film, such as $Si_3N_4$, $Al_2O_3$, HfAlO, or HfSiO, as a charge storage layer instead of a conductive floating gate.

Referring to FIG. 2, in the flash memory cell 10, a tunnel oxide forming the insulation film 17 maintains its high quality during initial programming. Therefore, the detrapping effect, which causes electrons or holes that have been injected or trapped in the floating gate 16, to be released is not significant. However, if the stress to the tunnel oxide increases, the detrapping effect may occur to thereby release electrons or holes from the floating gate 16 after a P/E operation. This detrapping effect may proceed so rapidly that the accuracy of the data states or the reliability of the flash memory cell may be severely degraded.

For example, as shown in FIGS. 3 and 4, if there is a significant detrapping effect, each distribution profile of threshold voltages may become wider than its desired model. With the wider distribution profile of threshold voltages for each of data state, state-to-state window margins become smaller, which narrows a margin between a voltage applied to a selected word line during a read operation and an edge of the threshold-voltage distribution. Moreover, since the window margin of the threshold-voltage distributions for the multi-level cells, as shown in FIG. 4, is narrower than that for single-level cells, the detrapping effect is more serious in a multi-level cell versus a single-level cell.

SUMMARY

A method of verifying a programmed condition of a flash memory device according to embodiments of the present invention includes determining a level of an additional verifying voltage in response to the number of programming/erasing cycles of memory cells, conducting a verifying operation to programmed memory cells with an normal verifying voltage lower than the additional verifying voltage, and selectively conducting an additional verifying operation with the additional verifying voltage to the program-verified memory cells in response to the number of programming/erasing cycles.

According to additional embodiments of the present invention, a method of programming a flash memory device, includes determining a level of an additional verifying voltage in response to the number of programming/erasing cycles of memory cells, programming the memory cells, conducting a verifying operation to the memory cells with a normal verifying voltage lower than the additional verifying voltage, selectively conducting an additional verifying operation with the additional verifying voltage to the program-verified memory cells in response to the number of programming/erasing cycles, and conducting an additional programming operation to the memory cells in response to a result of the additional verifying operation.

According to additional embodiments of the present invention, a method of programming a flash memory device, includes determining a verify type and a level of an additional verifying voltage in response to the number of programming/erasing cycles of memory cells, programming the memory cells, conducting a verifying operation to the memory cells with a normal verifying voltage lower than the additional verifying voltage, selectively conducting an additional verifying operation with the additional verifying voltage to the program-verified memory cells in response to the number of programming/erasing cycles, and conducting an additional programming operation to the memory cells with an additional program voltage in response to a result of the additional verifying operation, wherein the number of times of conducting the additional verifying operation and corresponding additional programming operation are determined by the verify type.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 5:
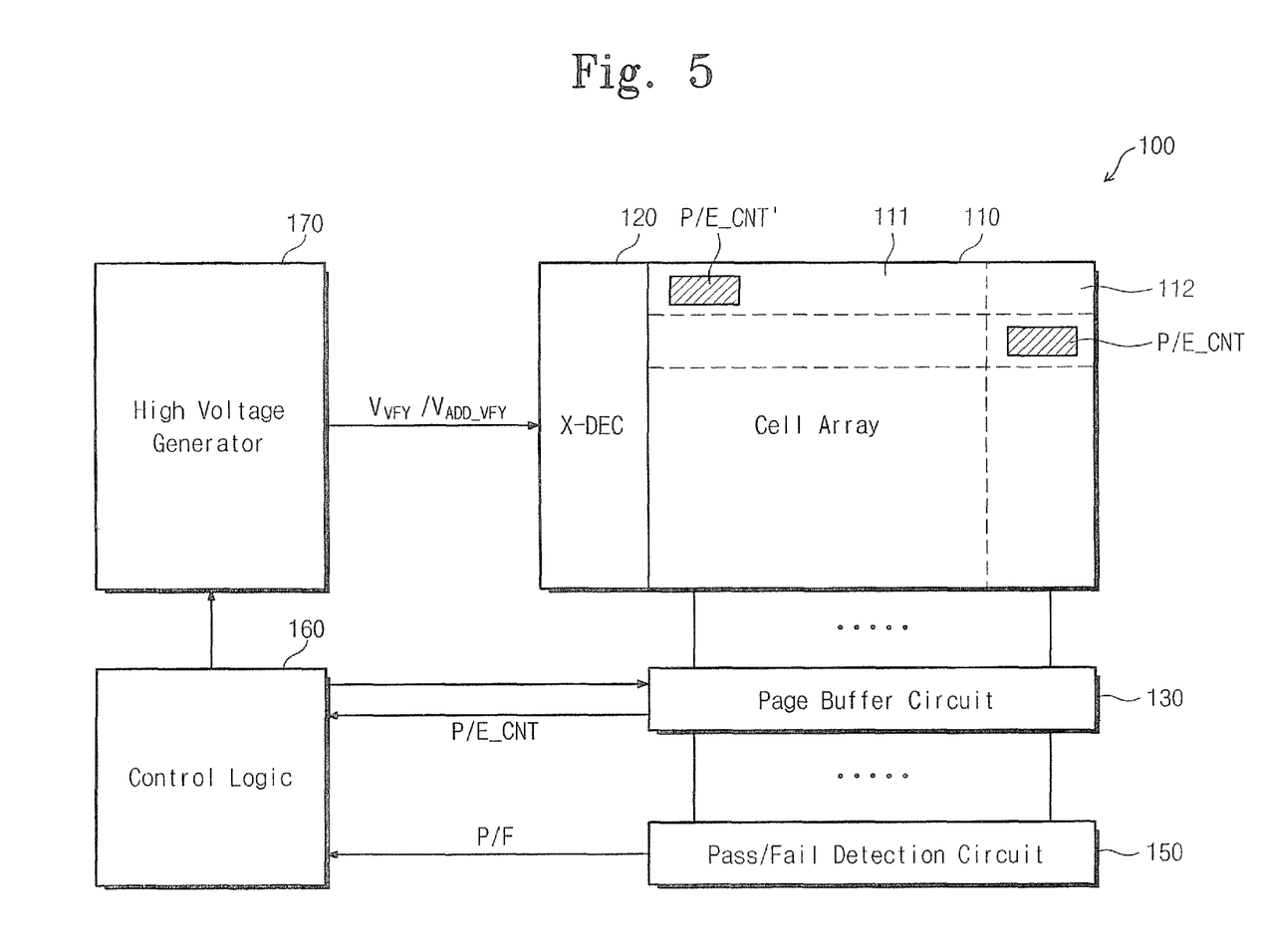
FIG. 5 is a block diagram of a flash memory device according to an embodiment of the present invention.

FIG. 5 is a block diagram of a flash memory device 100 according to an embodiment of the present invention, illustrating a functional structure of a NAND-type flash memory device. Embodiments of the invention may also include NOR-type flash memory devices, for example. Referring to FIG. 5, the flash memory device 100 is illustrated as including a memory cell array 110, an X-decoder 120, a page buffer circuit 130, a pass/fail detection circuit 150, control logic 160, and a high voltage generator 170. The memory cell array 110 includes a main region 111 and a hidden region 112. Each of the main and hidden regions 111 and 112 includes an array of the flash memory cells, such as those illustrated by FIG. 1. Each memory cell may store 1-bit data or n-bit data (n is 2 or an integer larger than 2).

The main region 111 stores data programmed or erased by a user. The hidden region 112 stores information that is not disclosed to a user (e.g., program/erase count values and metadata used in a flash translation layer (FTL)). Program/erase count values may be stored in a part of the main region 111, as well as in the hidden region 112. In FIG. 5, the program/erase count value corresponding to each block is noticed by $P/E_{13}$ CNT and the largest program/erase count value corresponding to the whole region of the memory cell array 110 is noticed by $P/E\_{1\ CNT'}$.

As will be described herein below, the flash memory device of the present invention selectively conducts the additional program/erase-verifying (program-verifying or erase-verifying) operation in response to the program/erase count values $P/E_{13}$ CNT or P/E_CNT'. According to a result of the additional program/erase-verify operation, the flash memory device selectively executes the program/erase (program or erase) operations corresponding thereto. By performing the additional program/erase-verify operation and the additional program/erase operation corresponding thereto, a variation of threshold voltage window can compensate for detrapping-based changes in the threshold voltage. As a result, it is possible to secure larger margins between adjacent threshold voltage windows, enhancing the data accuracy of the flash memory device. The program/erase operation according to an embodiment of the present invention may be operable with at least one of the two program/erase count values P/E_CNT and P/E_CNT'. For the convenience of description, this embodiment will be explained in the case of using P/E_CNT that corresponds to a block selected for the program/erase-verify operation. But, a range of the program/erase count values may not restrictive to P/E_CNT corresponding to a block selected for the program/erase-verify operation.

The rows of the memory cell array 110 are driven by the X-decoder 120 and the columns are driven by the page buffer circuit 130. The X-decoder 120 selects one row from memory blocks of the memory cell array 110 in compliance with row address information, and transfers a word-line voltage to the selected row from the high voltage generator 170. The high voltage generator 170 operates to generate a plurality of word line voltages for program, program-verify, erase, erase-verify, and read operations in response to the control signals provided from the control logic 160. The flash memory is programmed in an incremental step-pulse programming (ISPP) mode. Thus, both a normal program voltage $V_{PGM}$ to be used in the normal program operation and an additional program voltage $V_{ADD\_PGM}$ to be used in the additional program operation are activated with a stair-step sequence of increasing voltage levels.

The page buffer circuit 130 includes a plurality of page buffers. The page buffer circuit 130 is controlled by the control logic 160. Each page buffer functions as a sense amplifier or a write driver in accordance with an operation mode. In a read operation, data read out from the page buffer circuit 130 are output through a data input/output buffer circuit (not shown). On the other hand, data read out during a verify operation are provided to the pass/fail detection circuit 150. During a program operation, the page buffer circuit 130 receives data, which are to be programmed into the memory cell array 110, by way of the data input/output buffer circuit, and drives corresponding columns of bit lines with the program voltage (e.g., a ground voltage level) or a program-inhibition voltage (e.g., a power source voltage level) in accordance with the input data. In addition, the page buffer circuit 130 operates to read the program/erase count values P/E_CNT stored in the memory cell array 110 during the program/erase operation. The program/erase count values P/E_CNT read by the page buffer circuit 130 are provided to the control logic 160.

The pass/fail detection circuit 150 determines whether data read from the page buffer circuit 140 is the same as the pass data, during the program/erase operation, and provides the control logic 160 a pass/fail signal P/F as a result of the verification of the program/erase operation. The control logic 160 operates to control the program/erase operation for the flash memory device 100 in response to the pass/fail signal P/F generated from the pass/fail detection circuit 150. And, the control logic 160 controls operations of the page buffer circuit 130 and the high voltage generator 170, in response to the program/erase count value P/E_CNT read by the page buffer circuit 130, so as to selectively conduct additional program/erase-verify operations after the normal program/erase operation. For instance, if the program/erase count value P/E_CNT for a block to be programmed/erased is smaller than or equal to a predetermined value (e.g., 1K), it controls the flash memory device so that an additional program/erase-verify operation is not performed. Otherwise, if the program/erase count value P/E_CNT for a block to be programmed/erased is larger than a predetermined value (e.g., 1K), the control logic 160 controls the flash memory device to conduct the additional program/erase-verify operation. The high voltage generator 170 operates to generate a verify voltage $V_{VFY}$ or $V_{ADD-VFY}$, corresponding to an operation mode, in response to the control logic 160. Further, the page buffer circuit 130 conducts the normal program/erase operation, or sequentially conducts the normal program/erase operation followed by an additional program/erase-verify operation if the count value exceeds the predetermined value.

Figure 6:
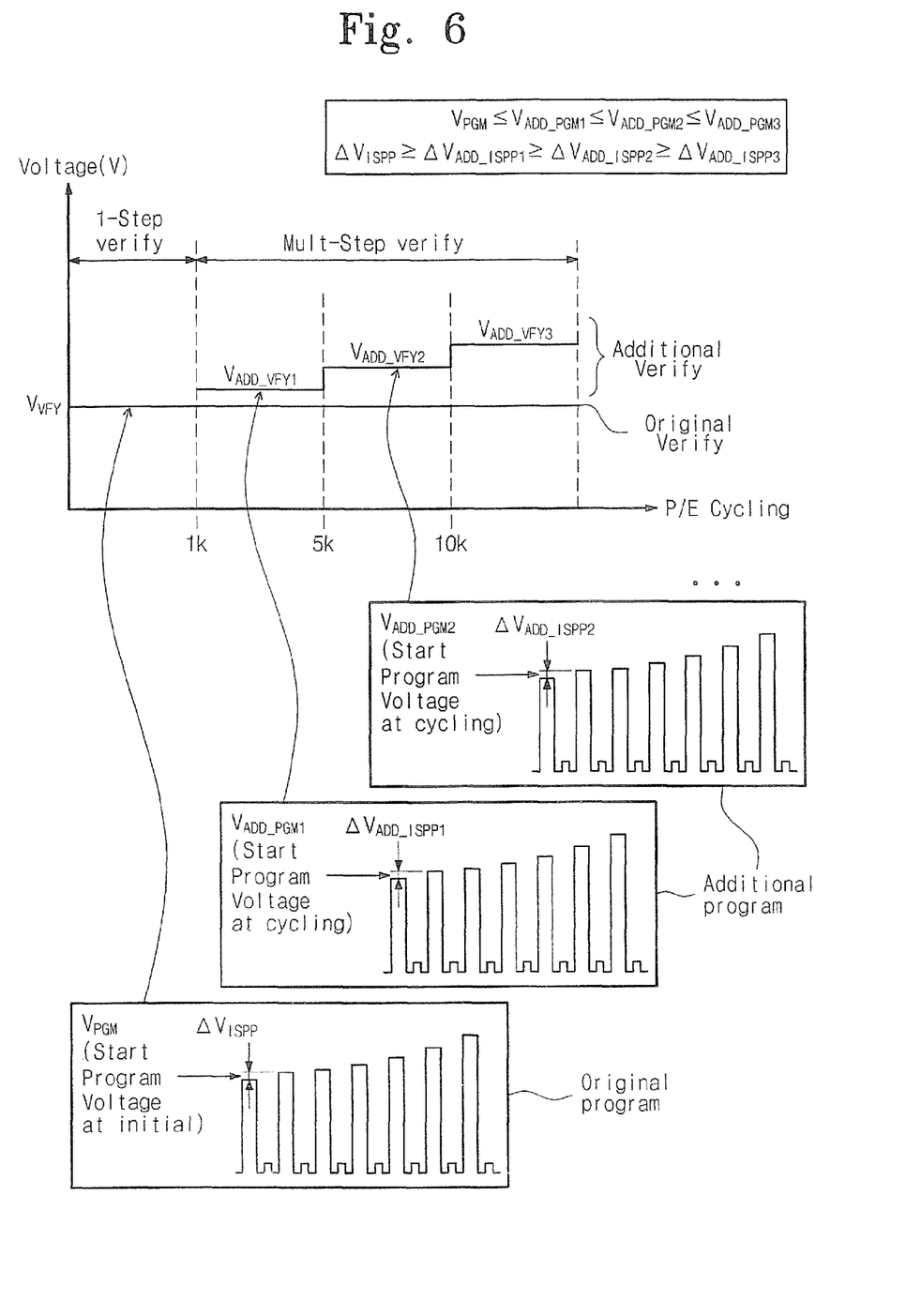
FIG. 6 is a graphic diagram showing levels of the verify voltages $V_{VFY}$ or $V_{ADD\_VFY}$ used in the flash memory device, according to embodiments of the present invention.
Figure 7:
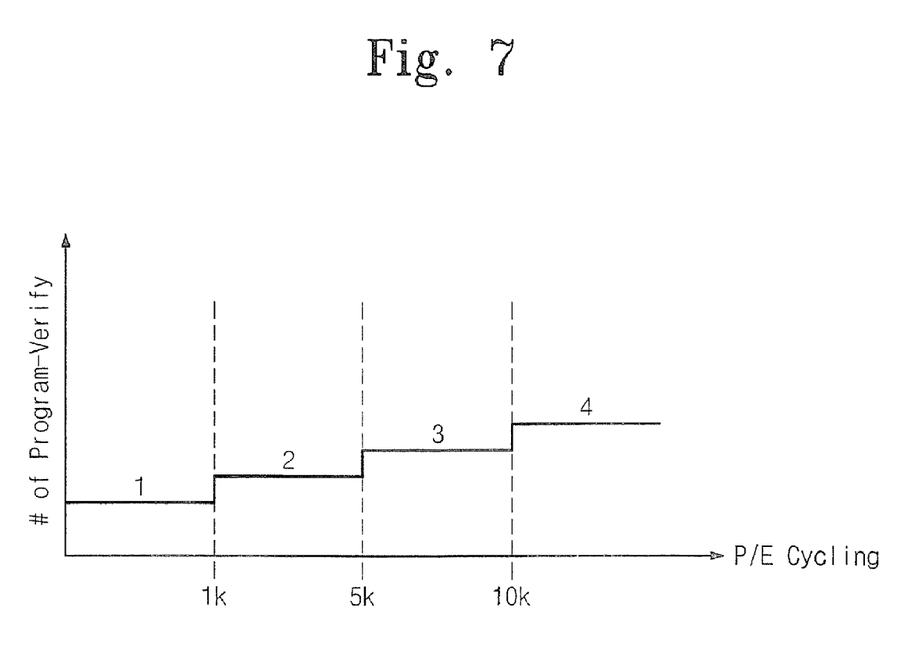
FIG. 7 is a graphic diagram showing number of program/erase-verifying operations used in the flash memory device, according to embodiments of the present invention.

FIG. 6 is a graphic diagram showing levels of the verify voltages $V_{VFY}$ or $V_{ADD-VFY}$ used in the flash memory device, according to embodiments of the present invention. FIG. 7 is a graphic diagram showing number of program/erase-verifying operations used in the flash memory device, according to embodiments of the present invention. Referring to FIGS. 6 and 7, the verify voltages used by the present invention may be differentiated. The first verify voltage $V_{VFY}$ (hereinafter, referred to as 'normal verify voltage') is used in a normal operation. The second verify voltage $V_{ADD-VFY}$ is defined by the program/erase count value P/E_CNT. The normal verify voltage $V_{VFY}$ used in the normal program/erase operation is set to a fixed value using a conventional technique (e.g., by a trimming from an initial test after the fab-out of the flash memory chip). In performing the verify operation with the normal verify voltage $V_{VFY}$, which is fixed to a single value, if the program/erase operations of the flash memory are carried out over predetermined cycle times (e.g., 1K P/E cycles), there is no attempt to correct for threshold voltage variation caused by the detrapping effect.

For the purpose of preventing excessive threshold voltage variations, the present invention provides the flash memory device with a function of checking the cycle times of the program/erase operations (i.e., the P/E_CNT value). According to the cycle times of the program/erase operations, the control circuit 160 conducts additional program/erase-verify operations. For instance, if the P/E_CNT is smaller than or equal to 1K, the detrapping probability is lower and the normal program/erase-verify operation is carried out exclusively with the normal verify voltage $V_{VFY}$. In this case, the program/erase-verify operation includes one step. This is called an 1-step program/erase-verify operation. But if the P/E_CNT is larger than 1K, the detrapping probability is higher. In this case, one or more additional program/erase-verifying operations are performed subsequently after the normal program/erase-verifying operation. This is called a multi-step program/erase-verify operation. The multi-step program/erase-verify operation can be classified to 2-step program/erase-verify operation, 3-step program/erase-verify operation, 4-step program/erase-verify operation and so on, according to the P/E_CNT. For instance, if the program/erase count value P/E_CNT is larger than 1K but smaller than 5K, the verify type is determined as the 2-step verify. In this case, more than 2 verify operations are performed. If the program/erase count value P/E_CNT is larger than 5K but smaller than 10K, the verify type is determined as the 3-step verify. In this case, more than 3 verify operations are performed. If the program/erase count value P/E_CNT is larger than 10K, the verify type is determined as the 4-step verify. In this case, more than 4 verify operations are performed. As the program/erase count value P/E_CNT increases, the number of verify operations are increased. An example of the number of verify operation being conducted in the respective i-step program/erase-verify operation ($i \geq 1$) is shown in FIG. 7.

However, the number of verify operation for the respective i-step program/erase-verify operation ($i \geq 1$) does not set to a fixed value. That is, the verify operation can be iterated in the respective i-step program/erase-verify operation. For instance, the normal verify operation for the 1-step verify operation can be iterated several times. Also, the additional verify operation for the i-step verify operation can be iterated several times. According to the iterative verify operations, more precise verification results can be obtained without noise.

The additional program/erase-verify operation uses the additional verification voltage $V_{ADD-VFY}$. The level of $V_{ADD-VFY}$ is determined by the program/erase count value P/E_CNT. The program/erase count value P/E_CNT of a memory block to be programmed is used to control the level of the verification voltage. For example, if the program/erase count value P/E_CNT is larger than 1K but smaller than 5K, the additional verify voltage $V_{ADD-VFY}$ is set as a first additional verify voltage $V_{ADD-VFY1}$, which is higher than the normal verify voltage $V_{VFY}$. If the program/erase count value P/E_CNT is larger than 5K but smaller than 10K, the additional verify voltage $V_{ADD-VFY}$ is set as a second additional verify voltage $V_{ADD-VFY2}$, which is higher than the first additional verify voltage $V_{ADD-VFY1}$. If the program/erase count value P/E_CNT is larger than 10K, the additional verify voltage $V_{ADD-VFY}$ is set as a third additional verify voltage $V_{ADD-VFY3}$, which is higher than the second additional verify voltage $V_{ADD-VFY2}$. Here, the levels of the first through third additional verify voltages $V_{ADD-VFY1}$ and $V_{ADD-VFY3}$ may be established experimentally for a given device or design.

After the additional program/erase-verify operation, an additional program operation is selectively carried out in accordance with a result of the additional program/erase-verification. An additional program/erase voltage $V_{ADD\_PGM}$ for the additional program/erase operation can be defined based on the program/erase count value P/E_CNT. The additional program/erase voltage $V_{ADD\_PGM}$ corresponds with the additional program/erase-verify voltage $V_{ADD\_VFY}$. Examples of the additional program voltages $V_{ADD\_PGM1}$ to $V_{ADD\_PGM3}$ are shown in FIG. 6.

Referring to FIG. 6, a first additional program voltage $V_{ADD\_PGM1}$, corresponds with the first additional verify voltage $V_{ADD\_VFY1}$. A second additional program voltage $V_{ADD\_PGM2}$ corresponds with the second additional verify voltage $V_{ADD\_VFY2}$. A third additional program voltage $V_{ADD\_PGM3}$ corresponds with the third additional verify voltage $V_{ADD\_VFY3}$. A level of the first additional program voltage $V_{ADD\_PGM1}$ is higher or equal to a level of a normal program voltage $V_{PGM}$ for the normal program. A level of the second additional program voltage $V_{ADD\_PGM2}$ is higher or equal to which of the first additional program voltage $V_{ADD\_PGM1}$. A level of the third additional program voltage $V_{ADD\_PGM3}$ is higher or equal to which of the second additional program voltage $V_{ADD\_PGM2}$. However, an increment $\Delta V_{ADD\_ISPP1}$ of the first additional program voltage $V_{ADD\_PGM1}$ is smaller than or equal to an increment $\Delta V_{ISPP}$ of the normal program voltage $V_{PGM}$. An increment $\Delta V_{ADD\_ISPP2}$ of the second additional program voltage $V_{ADD\_PGM2}$ is smaller than or equal to the increment $\Delta V_{ADD\_ISPP1}$ of the first additional program voltage $V_{ADD\_PGM1}$. An increment $\Delta V_{ADD\_ISPP3}$ of the third additional program voltage $V_{ADD\_PGM3}$ is smaller than or equal to the increment $\Delta V_{ADD\_ISPP2}$ of the second additional program voltage $V_{ADD\_PGM2}$. These voltage-applying characteristics enable more accurately control of the window ranges of the threshold voltages.

Figure 8:
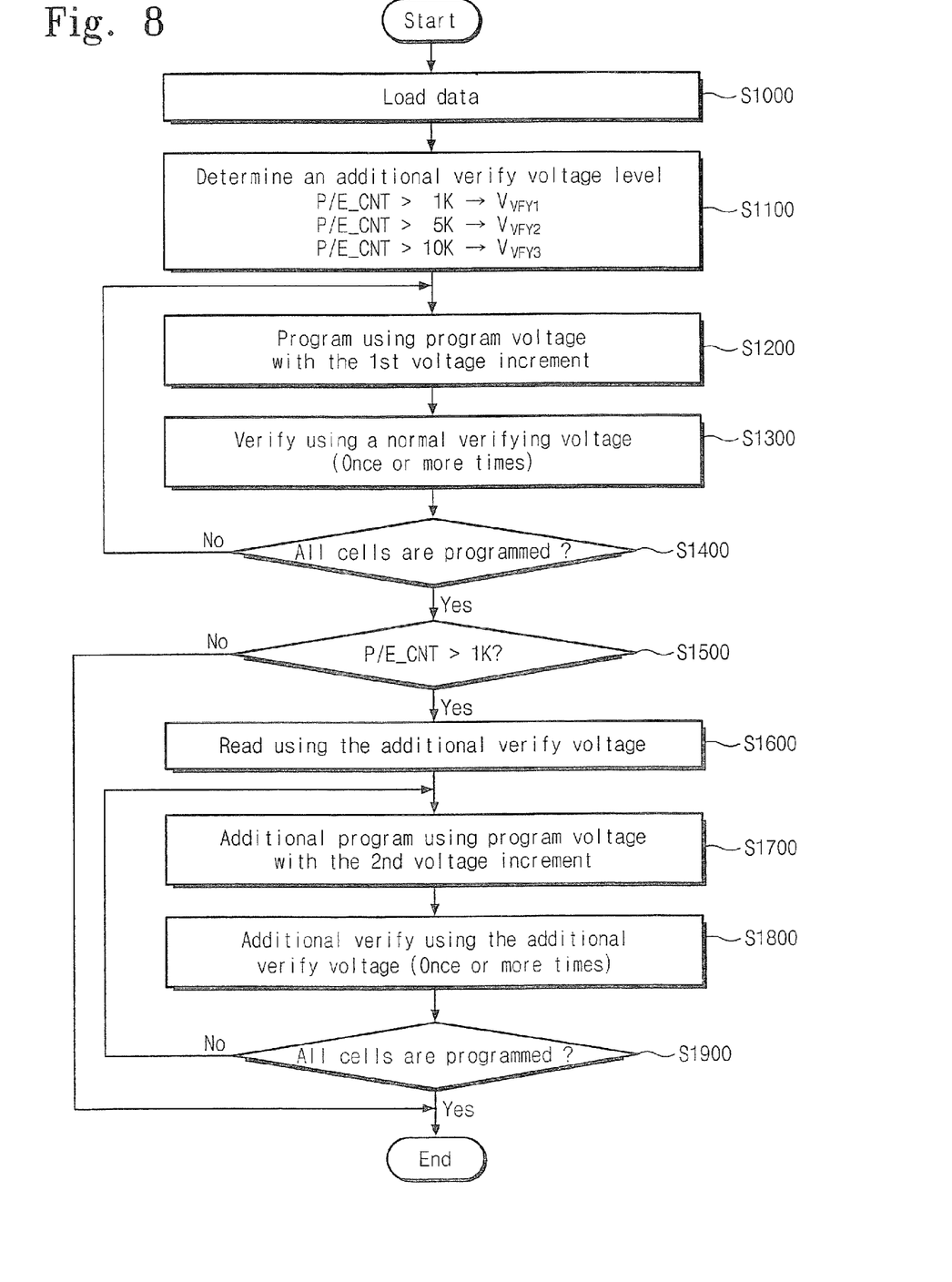
FIG. 8 is a flow chart exemplarily showing a programming method of the flash memory device in accordance with embodiments of the present invention.
Figure 9A:
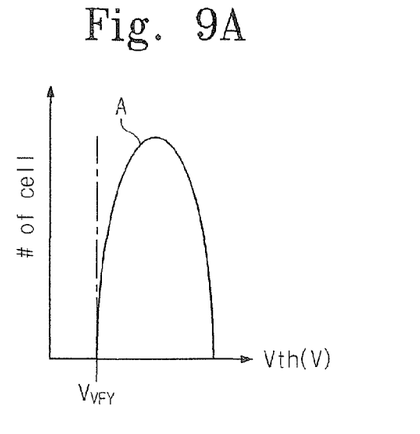
FIGS. 9A, 9B, and 9C are diagrams showing distribution profiles of threshold voltages achieved by using the programming method of the present invention.
Figure 9B:
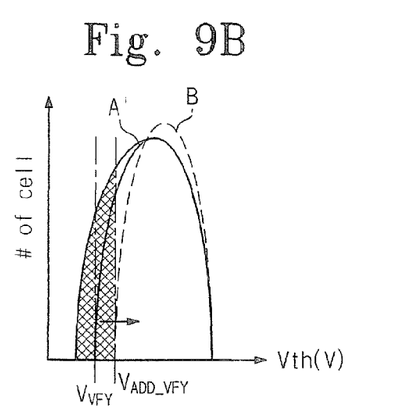
Figure 9C:
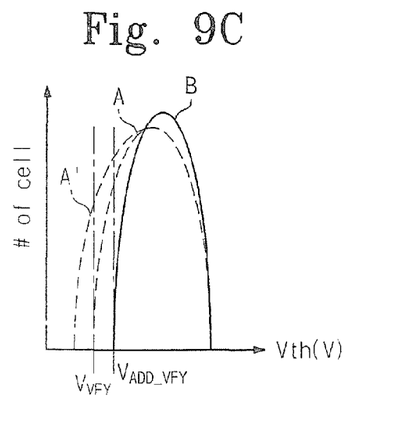

FIG. 8 is a flow chart exemplarily showing a programming method of the flash memory device in accordance with embodiments of the present invention. FIGS. 9A, 9B, and 9C are diagrams showing distribution profiles of threshold voltages achieved by using the programming method of the present invention.

Referring to FIG. 8, first, the flash memory device 100 loads data, which are to be programmed, into the page buffer circuit 130 for the program operation (step S1000). Then, the program/erase count value P/E_CNT of a memory block to be programmed is read out to determine a level of the additional verify voltage $V_{AND\_VFY}$ (step S1100). The level of the additional verify voltage $V_{AND\_VFY}$ is determined with reference to the program/erase count value P/E_CNT (i.e., the cycle times of the program/erase operations) having threshold count values of 1K, 5K, or 10K.

For instance, if the program/erase count value P/E_CNT is larger than 1K but smaller than 5K, the additional verify voltage $V_{ADD\_VFY}$ is set as the first additional verify voltage $V_{ADD\_VFY1}$ higher than the normal verify voltage $V_{VFY}$. If the program/erase count value P/E_CNT is larger than 5K but smaller than 10K, the additional verify voltage $V_{ADD\_VFY}$ is set as the second additional verify voltage $V_{ADD\_VFY2}$ higher than the first additional verify voltage $V_{ADD\_VFY1}$. If the program/erase count value P/E_CNT is larger than 10K, the additional verify voltage $V_{ADD\_VFY}$ is set as a third additional verify voltage $V_{ADD\_VFY3}$ higher than the second additional verify voltage $V_{ADD\_VFY2}$. In other words, as the program/erase count value P/E_CNT increases, the level of the additional verify voltage $V_{ADD\_VFY}$ increases.

After determining the level of the additional verify voltage $V_{ADD\_VFY}$, the normal program operation is carried out with the loaded data using the program voltage with the first voltage increment $\Delta V1$ (i.e., $\Delta V_{ISPP}$) (step S1200). A typical distribution profile of threshold voltages of memory cells after the program operation through the step S1200 is shown in plot A of FIG. 9A. Next, the normal verify voltage $V_{VFY}$ is put into the verify operation for verifying whether the program operation by the step S1200 has been normally completed (step S1300). In the step S1300, the verify operation using the normal verify voltage $V_{VFY}$ can be performed once or more times. The iterative verify operations prevent noise in the normal program operation to make precise verification result. Then, referring to result of the verification, the control circuit 160 determines whether all memory cells have been programmed (step 1400). From a result of the determination by the step S1400, if all memory cells have been programmed, the procedure goes to a step S1500. If all memory cells have not been fully programmed, the procedure returns to step S1200 to repeat the program and verify operations. The program and verify operations are repeated until the lowest threshold voltage of memory cell becomes higher than the normal verify voltage $V_{VFY}$.

Continuously, the step S1500 determines whether the program/erase count value P/E_CNT is larger than 1K. From a result of the determination by the step S1500, unless the program/erase count value P/E_CNT is larger than 1K, the procedure is terminated. From the determination by the step S1500, if the program/erase count value P/E_CNT is larger than 1K, the procedure goes to a step S1600.

Here, the condition that program/erase count value P/E_CNT is not over 1K means that the flash memory is only minimally influenced by the detrapping effect. Otherwise, the condition that the program/erase count value P/E_CNT is over 1K means that the data accuracy of the flash memory cells may become lower due to the detrapping effect. A distribution profile of threshold voltages, which is widened due to the detrapping effect, is shown by a curve A' of FIGS. 9B and 9C.

In the condition accompanied with the detrapping phenomenon, although the lowest threshold voltage of memory cell is set to be higher than the normal verify operation $V_{VFY}$ as shown in FIG. 9A, a window of the threshold voltages is widened as shown by the shadow region of FIG. 9B. As the number of the program/erase cycles increases, the shadow region of FIG. 9B may extend more and more. Therefore, the flash memory device according to an embodiment of the present invention conducts the additional verify operation and an additional program operation corresponding to the additional verify operation. As a result, the extended threshold-voltage distribution of the curve A' shown FIG. 9A changes to the curve shown in FIG. 9B.

Hereinafter will be described an additional verify operation and the additional program operation corresponding to the additional verify operation. First, in a step S1600, the additional verify voltage $V_{ADD\_VFY}$ (i.e., $V_{ADD\_VFY1}$ or $V_{ADD\_VFY2}$) determined by the step S1100 is enabled to read data from the programmed cells. The additional verify voltage $V_{ADD\_VFY}$ increases as the program/erase count value P/E_CNT becomes larger. If data read out by the step S1600 is included in the shadow region of FIG. 9B (i.e., if the threshold voltages of the programmed memory cells are lower than the additional verify voltage $V_{ADD\_VFY}$), the additional program operation is carried out to the corresponding memory cells (step S1700).

The program voltage $V_{ADD\_PGM}$ used in the additional program operation of the step S1700 contains the second voltage increment $\Delta V2$ (i.e., $\Delta V_{ADD\_ISPP1}$, $\Delta V_{ADD\_ISPP2}$, or $\Delta V_{ADD\_ISPP3}$). The second voltage increment $\Delta V2$ is smaller than or equal to the first voltage increment ΔV1 that is used in the normal program operation. The additional program voltages $V_{ADD\_PGM}$ (i.e., $V_{ADD\_PGM1}$, $V_{ADD\_PGM2}$, or $V_{ADD\_PGM3}$) and corresponding the increments ΔV2 (i.e., $\Delta V_{ADD\_ISPP1}$, $\Delta V_{ADD\_ISPP2}$, or $\Delta V_{\_ISPP3}$) are shown in FIG. 6.

Subsequently, an additional verify operation is carried out to determine whether the additional program operation has been normally completed (step S1800). In the step S1800, the additional verify operation using the additional verify voltage $V_{ADD\_VFY}$ can be performed once or more times. The iterative additional verify operations prevent noise in the additional program operation to make precise verification result. The additional verify operation of the step S1800 uses the additional verify voltage $V_{ADD\_VFY1}$, $V_{ADD\_VFY2}$, or $V_{ADD\_VFY3}$. After the additional verify operation, the control circuit 160 determines whether all memory cells have been programmed (step S1900). From the determination by the step S1900, if all memory cells have been programmed, the procedure is terminated. If all the memory cells have not been programmed, the procedure turns to the step S1700 to repeat the additional program and verify operations. After the program and verify operations, the threshold-voltage distribution profile is shown in FIG. 9C.

The flash memory device according to embodiments of the present invention selectively conducts an additional program/erase-verify operation and an additional program/erase operation corresponding to the additional program/erase-verify operation, in response to a program/erase count value, which may be stored in the memory cell array. With the additional program/erase-verify operation and the additional program/erase operation, the control circuit 160 is able to effectively compensate for a variation of the threshold voltage windows due to the detrapping effect, which enhances the data accuracy of the flash memory device.

In particular, the operational scheme of controlling threshold voltages, according to the present invention, is also able to locally compensate for the threshold-voltage variations in a specific region (refer to FIG. 9B). In other words, it is possible to finely adjust those regions that are out of a predetermined range, without shifting the threshold-voltage window for the whole memory array 110. Therefore, although the flash memory device is more dense to decrease margins between threshold-voltage windows, the control circuit 160 is able to secure the data accuracy by controlling the threshold voltages to a fine degree.

Thus, as described above with respect to FIGS. 5-9C, an integrated circuit device according to embodiments of the present invention includes a flash memory device 100, which has an array 110 (e.g., multi-block array) of non-volatile memory cells therein. The flash memory is configured to perform program-verify operations on the memory cells within the array. In particular, the flash memory is configured to perform a verify operation on at least one memory cell in the array using a verify voltage (e.g., $V_{VFY}$) that changes in magnitude in response to at least one change in a programming age of the at least one memory cell. According to these embodiments of the invention, the programming age of the at least one memory cell may be measured as a number of program/erase cycles (i.e., P/E cycles) that the at least one memory cell has undergone during the life of the flash memory. As illustrated by FIG. 6, the flash memory 100 is configured so that the verify voltage used during the verify operation is increased from an original verify voltage level to a first elevated voltage level (e.g., $V_{ADD\_VFY1}$) in response to detecting that the programming age of the at least one memory cell has exceeded a first threshold number of program/erase cycles (e.g., 1K P/E cycles) and then further increased to a second elevated voltage level (e.g., $V_{ADD\_VFY2}$) in response to detecting that the programming age of the at least one memory cell has exceeded a second threshold number of program/erase cycles (e.g., 5K P/E cycles).

According to additional embodiments of the present invention, the flash memory 100 is configured to read the programming age of the at least one memory cell from the array 110 during the verify operation. Moreover, in the event the memory array is arranged into multiple blocks 111 of non-volatile memory cells, then each block 111 of non-volatile memory cells may include memory cells (e.g., cell within the hidden region 112) configured to store a corresponding per-block programming age (shown as P/E_CNT in FIG. 5), which identifies the number of programming/erase cycles the corresponding block or row has undergone.

Alternative embodiments of the present invention may also include a flash memory 100 having an array 110 of non-volatile memory cells therein. The flash memory 100 is configured to evaluate an age of at least one memory cell in the array 110 when verifying whether the at least one memory cell has been sufficiently programmed during an operation to program the at least one memory cell from an erased state to a first program state. In these embodiments, the flash memory may read the age of the at least one memory cell from the array during the operation to program the at least one memory cell. The flash memory may also include a page buffer 130, which is electrically coupled to the array 110, and a control circuit 160, which is electrically coupled to the page buffer 130. During a programming operation, the flash memory may transfer the age of the at least one memory cell from the array 110 to the page buffer 130 when verifying whether the at least one memory cell has been sufficiently programmed. The flash memory 100 may also transfer the age of the at least memory cell from the page buffer 130 to the control circuit 160 so that the control circuit 160 can determine a correct verify voltage to use based on the age of the memory cell(s) to be programmed.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit device, comprising:
a flash memory having an array of non-volatile memory cells therein, said flash memory configured to perform a program-verify operation on at least one memory cell in the array using a verify voltage that changes in response to at least one change in a programming age of the at least one memory cell that is measured as a number of program/erase cycles that the at least one memory cell has undergone;
wherein said flash memory is further configured so that the verify voltage used during the program-verify operation increases to a first elevated value in response to detecting that the programming age of the at least one memory cell has exceeded a first threshold number of program/erase cycles.

2. The device of claim 1, wherein said flash memory is further configured so that the verify voltage used during the program-verify operation increases from the first elevated value to a second elevated value in response to detecting that the programming age of the at least one memory cell has exceeded a second threshold number of program/erase cycles greater than the first threshold number.

3. The device of claim 1, wherein said flash memory is further configured to read the programming age of the at least one memory cell from the array during the program-verify operation.

4. The device of claim 1, wherein said flash memory is further configured to read the programming age of the at least one memory cell from the array.

5. The device of claim 1, wherein the array comprises multiple blocks of non-volatile memory cells therein along with corresponding memory cells configured to store per-block programming ages.

6. An integrated circuit device, comprising:
a flash memory having an array of non-volatile memory cells therein, said flash memory configured to evaluate an age of at least one memory cell in the array when verifying whether the at least one memory cell has been sufficiently programmed during an operation to program the at least one memory cell from an erased state to a first program state;
wherein said flash memory comprises a page buffer electrically coupled to the array and a control circuit electrically coupled to the page buffer; and
wherein said flash memory is further configured to transfer the age of the at least memory cell from the array to the page buffer when verifying whether the at least one memory cell has been sufficiently programmed.

7. The device of claim 6, wherein said flash memory is further configured to read the age of the at least memory cell from the array during the operation to program the at least one memory cell.

8. The device of claim 6, wherein said flash memory is further configured to transfer the age of the at least memory cell from the page buffer to the control circuit.

9. A method of operating a flash memory device, comprising:
programming a row of non-volatile memory cells in a flash memory array;
reading data from the row of non-volatile memory cells; and
verifying the data to determine whether at least one of the non-volatile memory cells in the row has been sufficiently programmed relative to a verify voltage having a magnitude that is a function of a programming age of the row.

10. The method of claim 9, wherein the function is a step-wise function.

11. The method of claim 10, wherein the step-wise function increases at 1k, 5k and 10k programming age thresholds.

12. The method of claim 10, wherein the programming age of the row is measured as a number of program/erase cycles that the row has undergone.

13. The method of claim 9, wherein reading data comprises reading data and a programming age of the row from the row of non-volatile memory cells.

14. The method of claim 13, wherein the function is a step-wise function.

15. The method of claim 9, wherein reading data comprises reading data and a programming age of the row.

* * * * *